(12) United States Patent
Matuz et al.

(10) Patent No.: US 9,015,565 B2
(45) Date of Patent: Apr. 21, 2015

(54) METHOD FOR RECOVERY OF LOST DATA AND FOR CORRECTION OF CORRUPTED DATA

(75) Inventors: Balazs Matuz, Gilching (DE); Gianluigi Liva, Munich (DE)

(73) Assignee: Deutsches Zentrum Fuer Luft-und Raumfahrt E.V., Cologne (DE)

( * ) Notice: Subject to any disclaimer, the term of this patent is extended or adjusted under 35 U.S.C. 154(b) by 178 days.

(21) Appl. No.: 13/767,979

(22) PCT Filed: Aug. 19, 2011

(86) PCT No.: PCT/EP2011/064291
§ 371 (c)(1),
(2), (4) Date: Feb. 15, 2013

(87) PCT Pub. No.: WO2012/025457
PCT Pub. Date: Mar. 1, 2012

(65) Prior Publication Data
US 2013/0151932 A1    Jun. 13, 2013

(30) Foreign Application Priority Data
Aug. 24, 2010    (DE) .......................... 10 2010 035 210

(51) Int. Cl.
*H03M 13/00* (2006.01)
*G06F 11/10* (2006.01)
(Continued)

(52) U.S. Cl.
CPC ............ *G06F 11/10* (2013.01); *H03M 13/1105* (2013.01); *H03M 13/1108* (2013.01);
(Continued)

(58) Field of Classification Search
CPC .............. G06F 11/10; H03M 13/1105; H03M 13/1108; H03M 13/373; H03M 13/6541; H03M 13/616; H04L 1/0057; H04L 1/0061

USPC ......................................................... 714/776
See application file for complete search history.

(56) References Cited

U.S. PATENT DOCUMENTS 4,556,977 A  *  12/1985  Olderdissen et al. ......... 714/782
2003/0012315 A1     1/2003  Fan
(Continued)

FOREIGN PATENT DOCUMENTS

DE       102006028947 A1   12/2007
EP          2134018 A1   12/2009
(Continued)

OTHER PUBLICATIONS

Author: Jorg Nonnenmacher, Ernst W. Biersack; Title: Parity-Based Loss Recovery for Reliable Multicast Transmission; Publisher and Date: IEEE/ACM Transactions on Networking, vol. 6, No. 4, Aug. 1998.*

(Continued)

*Primary Examiner* — April Y Blair
*Assistant Examiner* — Thien D Nguyen
(74) *Attorney, Agent, or Firm* — Ohlandt, Greeley, Ruggiero & Perle, LLP (57) ABSTRACT

A method for recovery of lost data and for correction of corrupted data transmitted from a sending device to a receiver device, the method comprising the steps: encoding the data by an encoder connected to the sending device, transmitting the data from the sending device to the receiver device via a transmitting device, and decoding the data by a decoder connected to the receiver device, whereby lost and/or corrupted data is recovered during decoding is conducted by solving the system of equations of a parity check matrix H.

4 Claims, 5 Drawing Sheets (51) Int. Cl.
*H03M 13/11* (2006.01)
*H03M 13/37* (2006.01)
*H04L 1/00* (2006.01)

(52) U.S. Cl.
CPC .......... *H03M13/373* (2013.01); *H03M 13/616* (2013.01); *H03M 13/6541* (2013.01); *H04L 1/0057* (2013.01); *H04L 1/0061* (2013.01)

(56) References Cited

U.S. PATENT DOCUMENTS

| | | | |
|---|---|---|---|
| 2005/0149833 A1* | 7/2005 | Worley et al. | 714/781 |
| 2006/0059410 A1 | 3/2006 | Santraine et al. | |
| 2006/0282756 A1* | 12/2006 | Gammel et al. | 714/801 |
| 2007/0079216 A1* | 4/2007 | Bell et al. | 714/763 |
| 2007/0136644 A1* | 6/2007 | Katagiri | 714/777 |
| 2009/0217124 A1* | 8/2009 | Litsyn et al. | 714/752 |
| 2009/0292966 A1* | 11/2009 | Liva et al. | 714/752 |
| 2010/0169737 A1* | 7/2010 | Litsyn et al. | 714/752 |
| 2010/0275088 A1* | 10/2010 | Graef | 714/752 |
| 2011/0047445 A1* | 2/2011 | Liva | 714/786 |
| 2011/0246862 A1* | 10/2011 | Graef | 714/785 |
| 2011/0276856 A1* | 11/2011 | Litsyn et al. | 714/752 |
| 2013/0111292 A1* | 5/2013 | Obata et al. | 714/752 |

FOREIGN PATENT DOCUMENTS

| | | |
|---|---|---|
| WO | 2003105350 A1 | 12/2003 |
| WO | 2007068554 A | 6/2007 |

OTHER PUBLICATIONS

Author: Gagan Rath and Christine Guillemot; Title: Performance Analysis and Recursive Syndrome Decoding of DFT Codes for Bursty Erasure Recovery; Publisher: IEEE Transactions on Signal Processing, vol. 51, No. 5, May 2003.*

International Search Report dated Nov. 10, 2011 for PCT application No. PCT/EP2011/064291.

European Search Report dated Jan. 12, 2009 for European application No. EP 08 15 6794.

International Preliminary Report on Patentablity (IPRP) for PCT application No. PCT/EP2011/064291.

Paolini et al; "Low-Complexity LDPC Codes with Near-Optimum Performance over the BEC"; Apr. 18, 2008; pp. 1-9.

Liva et al; "Pivoting Algorithms for Maximum Likelihood Decoding of LDPC Codes over Erasure Channels"; IEEE Globecom; 2009; pp. 1-3.

* cited by examiner

METHOD FOR RECOVERY OF LOST DATA AND FOR CORRECTION OF CORRUPTED DATA

BACKGROUND

1. Field of the Disclosure

The disclosure relates to a method for recovery of lost data and for correction of corrupted data which are transmitted from a transmitter device to a receiver device. First, coding of said data is performed by means of an encoder connected to the transmitter device. Subsequently, said data is transmitted from the transmitter device to the receiver device via a transmission system, and said data is decoded preferably through application of a Low Density Parity Check method by means of a decoder connected to the receiver device, wherein lost data and for correction of corrupted data is restored during decoding.

2. Discussion of the Background Art

The transmitted data can be audio or video streams, for instance. From a transmitter device which makes these data available, the data is transmitted e.g. to a mobile receiver device. The mobile receiver device can be, for instance, a mobile phone, a PDA or another mobile end device. Alternatively, data can also be transmitted from a transmitter device to a stationary receiver device.

Examples of standards used for the transmission of data to mobile end devices include DVB-H, MBMS and, to be expected in the near future, DVB-SH. The concept that is proposed works also in point-to-point communications.

In order to guarantee a good transmission quality, it is required to verify the correct transmission of data or data packets to the receiver device. Various methods exist for recovery of lost data and for correction of corrupted data which were not correctly transmitted to the receiver device.

A known method for recovery of lost data and for correction of corrupted data is the Low Density Parity Check (LDPC) method or the Low Density Parity Check Code. This method is applied on a so-called erasure channel. Apart from an application by coding on the level of the physical layer, further applications exist in the field of a Packet Erasure Channel (PEC).

Figure 1:
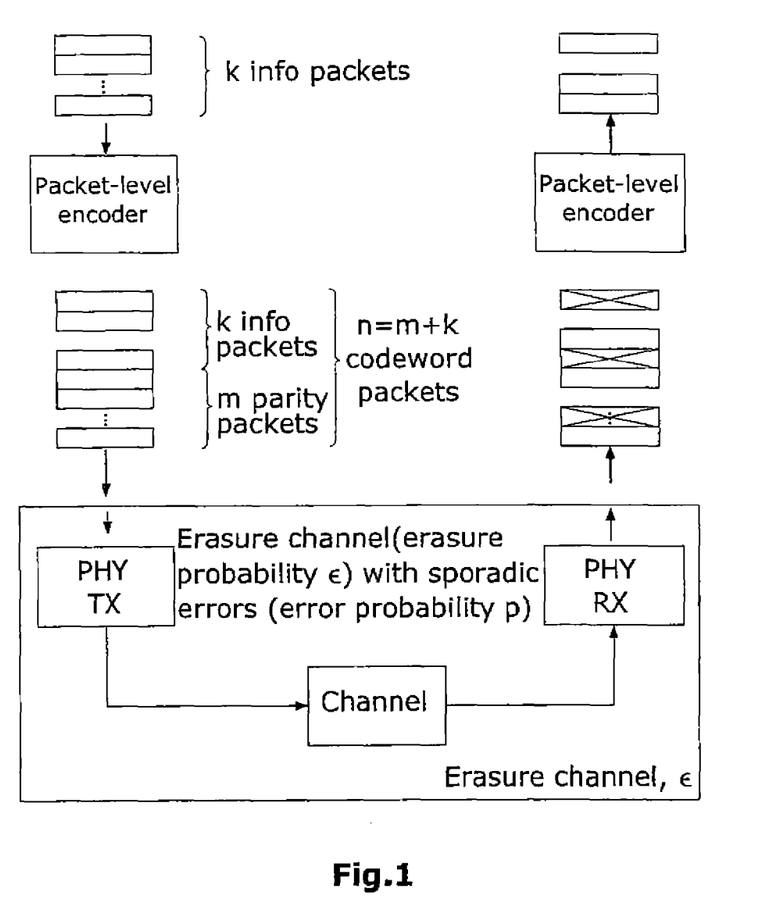
FIG. 1 is a flow diagram of the data transmission between a transmitter device and a receiver device as practicable also in the method of the disclosure.

FIG. 1 schematically illustrates an example of the recovery of lost data and for correction of corrupted data according to the state of the art. FIG. 1 depicts a case where it is desired to transmit a number k of information packets from a transmitter device (left-hand side) to a receiver device (right-hand side). Using a packet-level encoder on the transmitter side, the k information packets and the m parity packets will be assembled into n=m+k codeword packets. On the level of the physical layer, the packets are secured by an error correction code (e.g. a turbo code) and an error detection code (e.g. by a Cyclic Redundancy Check, CRC) so that corrupted packets can be removed. On the levels above the physical layer, packets are either correctly received or are considered lost in that they are erased because the CRC has detected a corrupted packet in the physical layer. Thus, from the layers thereabove, the transmission channel is seen as a so-called erasure channel, the packets representing the transmission units. However, in practice it happens that the CRC fails, leading to errors in packets that are marked as correct. This CRC failures cause a degradation in performance.

On the receiver side, the received codeword packets are decoded by the packet-level decoder so that the lost packets are recovered and the corrupted data is corrected.

The recovery of lost data and for correction of corrupted data can be realized by a redundancy of the data. The encoding process handled by the packet-level encoder is usually performed in a bit-wise (or byte-wise) manner using an encoder with a Generic Binary Linear Block Code. The decoding will subsequently be performed by solving the equation system which is defined by the parity-check matrix H of the code.

In order to recover lost packets, maximum likelihood decoding (ML) can be used to recover the erasures. The problem that each decoder has to face after receiving the symbols from the erasure channel can be described by solving the following equation:

$$H_{\bar{K}} \cdot x_{\bar{K}} = H_K \cdot x_K. \tag{1}$$

Here, $x_{\bar{K}}(x_K)$ denotes the set of erased (correctly received) symbols and $H_{\bar{K}}(H_K)$ the sub matrix composed of the corresponding columns of the parity check matrix. A proper way to solve linear equations is to apply Gaussian elimination. For large block lengths however, this would require lot of operations (e.g. a lot of additions for the specific case of GF(2)) and hence would be too time consuming. Therefore, some smart Gaussian elimination techniques were proposed in DE 10 2009 017 540, that take advantage of the sparseness of the parity check matrix. The goal is to apply time consuming brute-force Gaussian elimination only on a small sub matrix $P_l$. To this end $H_{\bar{K}}$ is put into a lower triangular form just by row and column permutations. However, this step might be blocked by some columns and the corresponding symbols are named reference symbols or pivots. Next, these columns are moved from $H_{\bar{K}}$ to a separate matrix P and the triangularization process can continue. As final outcome all erased symbols can be represented as a combination of reference symbols and hence it is sufficient to apply Gaussian elimination only on parts of P. If the number of pivots is low, P is small and Gaussian elimination is quick. Gaussian elimination has a complexity $O(n^3)$ where n stands for the block length here. If for example, the block length of the code is doubled a decoding speed can be expected that is eight times lower (at least for large block lengths).

Figure 2:
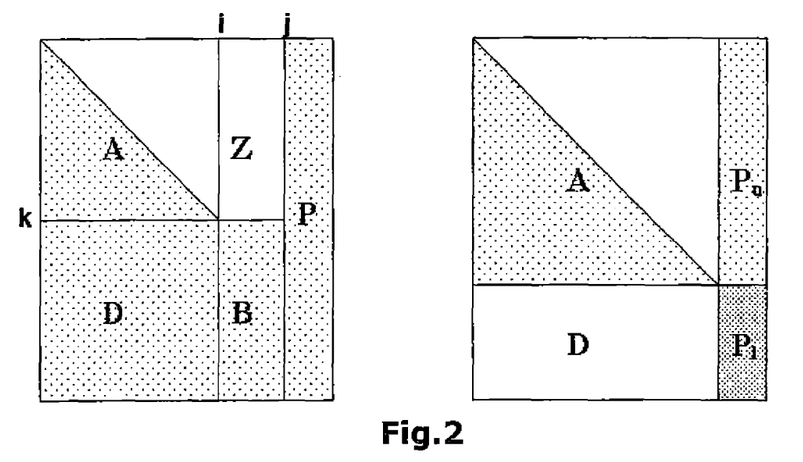
FIG. 2 shows the generation of submatrix $P_l$ of parity check matrix H according to the state of the art.

The smart Gaussian elimination process is described in more detail now. The matrix $H_{\bar{K}}$ can be divided into different sub-matrices as illustrated in FIG. 2. The main parts are A that represents the part in triangular form, B that is the part that has to be put in triangular form, D that is a sparse matrix in the beginning, but will be zeroed out in the end, Z that contains only zeroes and P that is made up of the columns that correspond to the reference symbols. In the end P can be divided into a sparse higher and a dense lower part. Now the following algorithm can be applied:

1. Search for any degree on row in B. The degree of a row (column) is defined by the number of one entries it contains. At the start B is equal to $H_{\bar{K}}$. In case no degree one row can be found continue with 4.
2. Apply only column and row permutations to move the single one entry in the degree one row to the top left of B.
3. Increase i and k by one. This way A becomes bigger in each step while the dimension of B shrinks. At the beginning A does not exist.
4. In case no degree one row could be found (cf. step 1) move a defined column of B and Z to P. Thus, also j is decreased by one. At the very beginning P does not exist. Which column of B and Z is chosen to be moved to P is defined by the pivoting strategy.
5. Repeat steps 1 to 4 until dim(P)≠0×l, where l is an arbitrary positive integer number.
6. Zero out D. Now the lower part of P named $P_l$ becomes dense.

Figure 3:
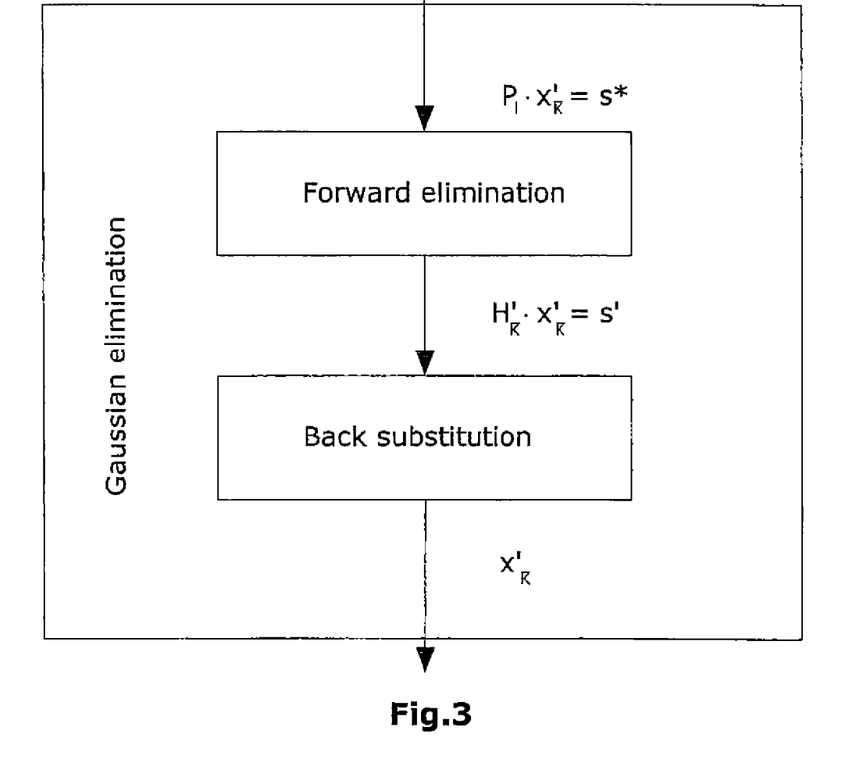
FIG. 3 illustrates the notation after forward elimination and back substitution are applied.

7. Perform brute-force Gaussian elimination on $P_I$. Brute-force Gaussian elimination consists of two steps (for the notation cf. FIG. 3):
   a. A forward elimination step to put the matrix $P_I$ in upper triangular form:
      We consider the set of equations $P_I \cdot x'_{\bar{R}} = s^*$. Here, $x'_{\bar{R}}$ are only the unknown pivots, thus a subset of the original unknowns $x_{\bar{R}}$. The vector $s^*$ is the corresponding known term which is made up of a multiplication of the corresponding part of the parity check matrix with the known code symbols $H^*_K \cdot x'_K$. Here, the known code symbols $x'_K$ are a permutation of those in equation (1).
      Then we perform (weighted) row additions to put $P_I$ in upper triangular form.
      After the forward elimination step, we obtain a modified set of equations $H'_{\bar{R}} \cdot x'_{\bar{R}} = s'$. Here, the matrix $H'_{\bar{R}}$ corresponds to $P_I$ in upper triangular form. $s'$ is the known term, also called syndrome. It is made up of a multiplication of the known code symbols and the corresponding part of the parity check matrix $H'_K \cdot x'_K$.
   b. A back substitution step, to get the pivots $x'_{\bar{R}}$.
8. If Gaussian elimination was successful, do another back substitution to recover the remaining unknowns. Otherwise, decoding failed.

Figure 6A:
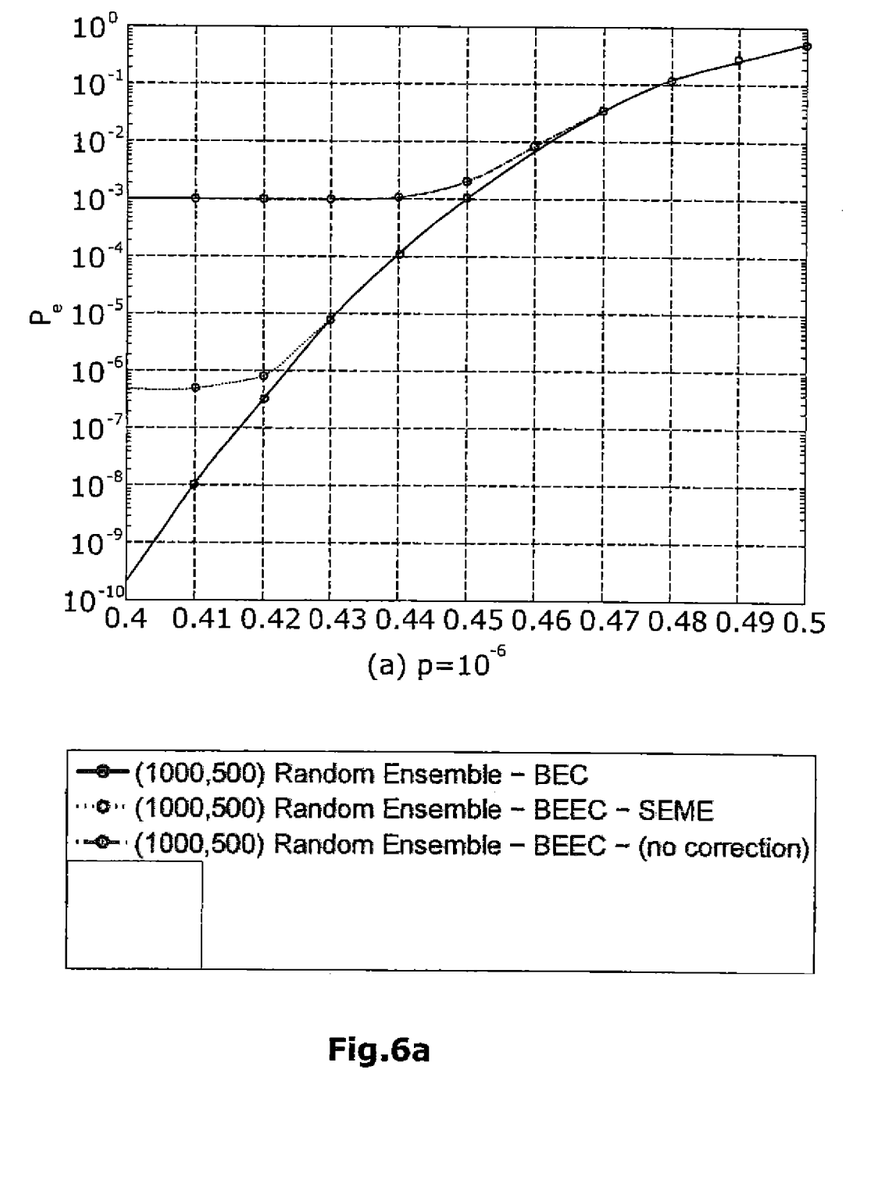

In case of undetected errors in the codeword symbols, the whole codeword will be corrupted due to the fact that the erroneous codeword symbol (or packet) will be involved in several additions. This leads to an error floor. This is illustrated in FIG. 6a, upper most curve, BEEC (no error correction).

A drawback of the described smart Gaussian elimination process is that it is not able to detect errors, nor correct errors in the codeword, leading to a loss in performance.

It is an object of the present disclosure to provide for a method for recovery of lost data and for correction of corrupted data which makes it possible to detect multiple errors and to correct single codeword errors.

SUMMARY

The method for recovery of lost data and for correction of corrupted data comprises the following steps:
   Encoding the data by an encoder (14) connected to the sending device (10)
   Transmitting the data from the sending device (10) to the receiver device (12) via a transmitting device (18) and
   Decoding the data by a decoder (16) connected to the receiver device (12), whereby lost and/or corrupted data is recovered during decoding is conducted by solving the system of equations of a parity check matrix H.

Figure 4:
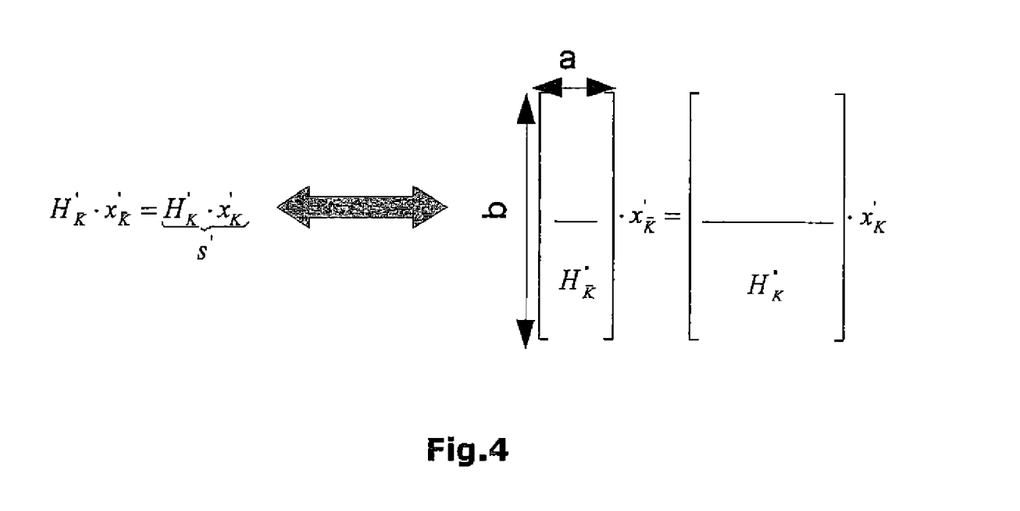
FIG. 4 is an illustration of the submatrices $H'_K$ and $H'_{\bar{K}}$ as well as of their respective submatrices.

A transmitted codeword is divided on the receiver side into a correctly received part and the erased part (see equation (1)). After that some manipulations (e.g. applying steps of smart Gaussian elimination) are performed. In general the disclosure can be applied on any set of equations as given by equation 1. However, as first step it is required to put the matrix $H_{\bar{R}}$ in a form that the lower part (b−a rows) contains only zero entries. A triangular form is not necessary, but desirable in practice (→back substitution). We obtain a modified set of equations (see FIG. 4):

$$H'_{\bar{R}} \cdot x'_{\bar{R}} = H'_K \cdot x'_K.$$

$H'_{\bar{R}}$ corresponds to $H_{\bar{R}}$ after some operations on $H_{\bar{R}}$ (e.g. steps of smart Gaussian elimination), whereby a result of these operations is that the lower part of $H'_{\bar{R}}$, namely $H''_{\bar{R}}$, consists of only zeros. $x'_K$ corresponds to known codeword symbols and $x'_{\bar{R}}$ to some unknown codeword symbols, e.g. as a small fraction of all unknown (e.g. pivots in case of smart Gaussian elimination).

Note again that the equation denoted here is already a transformation of the equations at the receiver side. Any transformation is allowed. However, as outcome we need a set of equations where the lower part of the matrix on the left side is zero (upper part is not necessarily triangular).

The inventive method further comprises the following method steps:
   Multiplying correctly received symbols $x'_K$ with the corresponding part $H'_K$ of the parity check matrix H, whereby this multiplication yields in a (partial) syndrome s',
   Checking the lower b−a rows of the syndrome s' for non-zero entries, whereby the rows containing non-zero entries are marked. Only the lower part of the syndrome is exploited, since contradictions can be observed only there.

According to the disclosure the following method steps are applied for correcting a single erroneous symbol in the transmitted codeword:
   Checking which columns $H'_K$ are involved in the calculation of the identified rows with the non-zero entries in the syndrome s',
   whereby if exactly one column is identified the corresponding symbol in the codeword is identified and
   the erroneous symbol in the codeword is corrected by subtraction of the identified non-zero syndrome value from the erroneous symbol. Note that in case of a single error all non-zero entries in the b−a lower rows of the syndrome are equal. If they are not equal, we must assume that multiple errors are present and the algorithm cannot be applied.

The matrix $H'_{\bar{R}}$ on which the inventive method is applied can be any matrix referring to the erased symbols, such as the one specified by equation (1). It is preferred that the inventive method is applied on a submatrix $P_I$ of the parity check matrix $H_{\bar{R}}$ which has been generated according to the method described in DE 10 2009 017 540.

The main idea for error correction on which the disclosure is based lies in the fact that usually more parity check equations are available than needed to recover the erasures (b>a). These parity check equations can then be used to check for inconsistencies, thus error in the packets. In case no or only a few additional parity check equations are available, the error might remain undetected. However, in this region of erasure probabilities close to capacity the BER/PER curves are not dominated by the residual errors due to falsely marked codeword symbols. A detailed description of a preferred embodiment of the enhanced decoder will be given hereafter.

Let's assume no errors for the moment. After performing steps 1.-6. of smart Gaussian elimination, we obtain a dense matrix $P_I$ (cf. FIG. 2) of dimension a×b. In general this matrix contains more rows than columns (a≤b). If the number of rows is less than the number of columns, Gaussian elimination on the matrix is not possible and hence the system of equations cannot be solved. It is assumed that this is not the case. Then, decoding is possible. To do so standard Gaussian eliminations are performed. We start with (weighted) row additions to put the matrix in an upper triangular form (forward elimination step). Then we do a back substitution. Assuming that the matrix $P_I$ is full rank, i.e. rank($P_I$)=a, we can resolve the erased code symbols, otherwise decoding fails. Since the rank of $P_I$ is a we will obtain b−a equations with all zeros. Note that all row additions (and multiplications) have to be performed also on the known term.

An efficient implementation of the single error multiple erasure decoding can be formalized in the following way:

i) Given the set of equations $H_{\bar{K}} \cdot x_{\bar{K}} = H_K \cdot x_K$, where $x_{\bar{K}}(x_K)$ denotes the unknown (known) vector of symbols and $H_{\bar{K}}(H_K)$ the corresponding part of the original parity check matrix, compute if possible a reduced sized matrix on which brute-force Gaussian elimination can be applied. An efficient implementation for codes having sparse parity check matrices is represented by steps 1.-6. of smart Gaussian elimination. The matrix $H_{\bar{K}}$ is reduced to $P_l$ in FIG. 2. Let a be the number of columns and b be the number of rows $P_l$.

ii) Perform forward Gaussian elimination step.
    a. In case rank($P_l$)=a, apply forward elimination on the matrix $P_l$. We obtain a system of equations $H'_{\bar{K}} \cdot x'_{\bar{K}} = H'_K \cdot x'_K = s'$ (cf. FIG. 3). Keep in mind that $H'_{\bar{K}}$ corresponds to $P_l$ in upper triangular form.
        i. If a==b, no error correction possible. Continue with step 6.
        ii. Otherwise proceed with step 3.
    b. If rank($P_l$)≠a stop decoding and signal failure.

iii) Detect if the codeword contains errors.
    a. If a==b, no error detection possible. Continue with step 6.
    b. If a<b consider the vector s" made up of the rows a+1, ..., b of the syndrome vector s'. Note that the elements of the syndrome vector may be packets of a specific size. Check for non-zero entries in s". Let e be a vector containing the row numbers of the detected non-zero entries in s".
        i. If e is empty, no errors in the codeword found. Continue with step 6.
        ii. If e is not empty, and the non-zero entries of the syndrome do not have the same value, we detected multiple errors. Correction is not possible. Stop decoding and signal decoding failure due to multiple errors.
        iii. Otherwise, continue with 4.

iv) Identify the erroneous symbol. Therefore, consider the sub matrix $H''_K$ that is made up of the rows a+1, ..., b of $H'_K$. Search for columns in $H''_K$ that have non-zero entries only at the rows specified by e.
    a. If no columns found, no error correction possible. Stop decoding and signal decoding failure due to error in the codeword.
    b. If multiple columns found, no error correction possible. Stop decoding and signal decoding failure due to error in the codeword.
    c. If a single column found, error correction is possible. Denote the number of the column by t. Continue with next step.

v) Perform single error correction. Therefore, take any non-zero entry of the reduced syndrome s' and subtract it from the code symbol corresponding to the identified column t. For GF(2) and extension fields of GF(2), the subtraction corresponds to an addition.

vi) Correcting the syndrome s' by the following method steps:
    a. Identify all elements of the syndrome s' for which the erroneous code symbol has been considered in the calculation
    b. Subtract the error pattern obtained from reduced syndrome s" from the identified rows of s', whereby the error pattern is given by any non-zero row of s" in case of a single error.

As an alternative it is possible to recompute the syndrome s' from $s' = H'_K * x'_K$ considering the corrected value of the code symbol in $x'_K$. In the approach proposed above s" is the lower part of s'.

vii) Perform back substitution and get the unknown pivots $x'_{\bar{K}}$ considering the corrected version of the syndrome s'.

viii) If Gaussian elimination was successful, do the back substitution, or alternatively an iterative decoding step to recover the remaining unknowns. Otherwise, decoding failed.

It is further preferred that $H'_{\bar{K}}$ corresponds to a submatrix $P_l$ generated by the following steps:

Bringing $H_{\bar{K}}$ in triangular form by column and/or row permutations

Moving columns of a submatrix B of $H_{\bar{K}}$ which block the triangularization process into a submatrix P of $H_{\bar{K}}$ so that the triangularization process can be continued, until the parity check matrix H except the submatrix P is brought into triangular form, whereby $P_l$ corresponds to the dense lower part of submatrix P after zeroing out submatrix D of $H_{\bar{K}}$.

In the following preferred embodiments of the invention are described in more detail with reference to the figures.

DETAILED DESCRIPTION OF THE PREFERRED EMBODIMENT

FIGS. 1 and 2 have been described in the introduction of the present application.

Due to row additions as part of smart Gaussian elimination the matrix $P_l$ ($H^*_K$) changes to $H'_{\bar{K}}(H'_K)$.

An illustration of the matrices $H'_K$, $H'_{\bar{K}}$ and their sub matrices $H''_K$ and $H''_{\bar{K}}$ is given in FIG. 4. For single error correction the sub matrices play a key role.

An example for a binary system of equations after the forward elimination step (Step 2.) is described below. The matrix corresponding to $H'_{\bar{K}}$ is the 8×3 matrix on the left here. Note that the lower part contains only zero entries. On the right we see the 8×5 matrix $H'_K$ describing the combinations of the known packets to obtain the unknowns. We introduce a new, simplified notation: $x_1, \ldots, x_5$ represent the correctly received code symbols, $x_6, \ldots, x_8$ the erased symbols which correspond to the pivots. This yields to:

$$\begin{bmatrix} 1 & 1 & 0 \\ 0 & 1 & 1 \\ 0 & 0 & 1 \\ 0 & 0 & 0 \\ 0 & 0 & 0 \\ 0 & 0 & 0 \\ 0 & 0 & 0 \\ 0 & 0 & 0 \end{bmatrix} \cdot \begin{bmatrix} x_6 \\ x_7 \\ x_8 \end{bmatrix} = \begin{bmatrix} 1 & 1 & 0 & 1 & 0 \\ 0 & 1 & 0 & 1 & 0 \\ 0 & 0 & 1 & 1 & 1 \\ 1 & 1 & 0 & 1 & 0 \\ 0 & 1 & 0 & 0 & 1 \\ 0 & 1 & 0 & 0 & 0 \\ 0 & 0 & 0 & 1 & 0 \\ 1 & 0 & 0 & 1 & 0 \end{bmatrix} \cdot \begin{bmatrix} x_1 \\ x_2 \\ x_3 \\ x_4 \\ x_5 \end{bmatrix}$$

If we set the correctly received symbols/packets to $[0\ 0\ 0\ 0\ 0]^T$ we can compute the syndrome on the right. For sake of simplicity the packets only consist of bit here, but all considerations also hold for packets with larger sizes.

$$\begin{bmatrix} 1 & 1 & 0 \\ 0 & 1 & 1 \\ 0 & 0 & 1 \\ 0 & 0 & 0 \\ 0 & 0 & 0 \\ 0 & 0 & 0 \\ 0 & 0 & 0 \\ 0 & 0 & 0 \end{bmatrix} \cdot \begin{bmatrix} x_6 \\ x_7 \\ x_8 \end{bmatrix} = \begin{bmatrix} 1 & 1 & 0 & 1 & 0 \\ 0 & 1 & 0 & 1 & 0 \\ 0 & 0 & 1 & 1 & 1 \\ 1 & 1 & 0 & 1 & 0 \\ 0 & 1 & 0 & 0 & 1 \\ 0 & 1 & 0 & 0 & 0 \\ 0 & 0 & 0 & 1 & 0 \\ 1 & 0 & 0 & 1 & 0 \end{bmatrix} \cdot \begin{bmatrix} 0 \\ 0 \\ 0 \\ 0 \\ 0 \end{bmatrix} = \begin{bmatrix} 0 \\ 0 \\ 0 \\ 0 \\ 0 \\ 0 \\ 0 \\ 0 \end{bmatrix}$$

As it can be seen we still have 5 equations in excess, which are zero on both sides.

Now let's assume that one of the known symbols contains an error. Here, this corresponds to flipping a bit in the known term.

In case the erroneous symbol is $x_1$, we get:

$$\begin{bmatrix} 1 & 1 & 0 \\ 0 & 1 & 1 \\ 0 & 0 & 1 \\ 0 & 0 & 0 \\ 0 & 0 & 0 \\ 0 & 0 & 0 \\ 0 & 0 & 0 \\ 0 & 0 & 0 \end{bmatrix} \cdot \begin{bmatrix} x_6 \\ x_7 \\ x_8 \end{bmatrix} = \begin{bmatrix} 1 & 1 & 0 & 1 & 0 \\ 0 & 1 & 0 & 1 & 0 \\ 0 & 0 & 1 & 1 & 1 \\ 1 & 1 & 0 & 1 & 0 \\ 0 & 1 & 0 & 0 & 1 \\ 0 & 1 & 0 & 0 & 0 \\ 0 & 0 & 0 & 1 & 0 \\ 1 & 0 & 0 & 1 & 0 \end{bmatrix} \cdot \begin{bmatrix} 1 \\ 0 \\ 0 \\ 0 \\ 0 \end{bmatrix} = \begin{bmatrix} 1 \\ 0 \\ 0 \\ 1 \\ 0 \\ 0 \\ 0 \\ 1 \end{bmatrix}$$

The equations above are no longer consistent. We see that for row 4 and 8 we get contradictions. (0=1) Hence we exploit the excess of equations to detect the error. Error correction can be now performed in the following way. We identified rows 4 and 8 of the syndrome to be affected by the error. Taking the matrix $H'_K$ we search for code symbols that are involved in the calculation of the $4^{th}$ and $8^{th}$ row of the syndrome, but not in rows 5, 6 and 7. This means that we look for columns of $H'_K$ for which rows 4 and 8 contain non-zero entries and rows 5, 6 and 7 contain zero entries. In case we are able to identify such a column, it is possible to identify the erroneous code symbol. In our case we identify column 1. To correct the erroneous code symbol, here one can xor the identified code symbol $x_1$ and the non-zero syndrome entry in row four of the syndrome. Alternatively the non-zero syndrome entry in row 8 could also be used.

Furthermore before resolving the system of equations, the syndrome has to be corrected. This can be done here by xor-ing row one (optionally also row 4 and 8) of the syndrome with the non-zero syndrome entry in row 4 (or row 8) of the syndrome. This leads to our original set of equations (first example with no errors) that can be solved, e.g. by back substitution.

Since a CRC is applied in practice the probability that an error occurs (CRC failure) in a codeword is very low and can be for example in the order of $10^{-6}$ to $10^{-8}$. Thus, the probability that more than one error is present in one codeword is very low.

Figure 5:
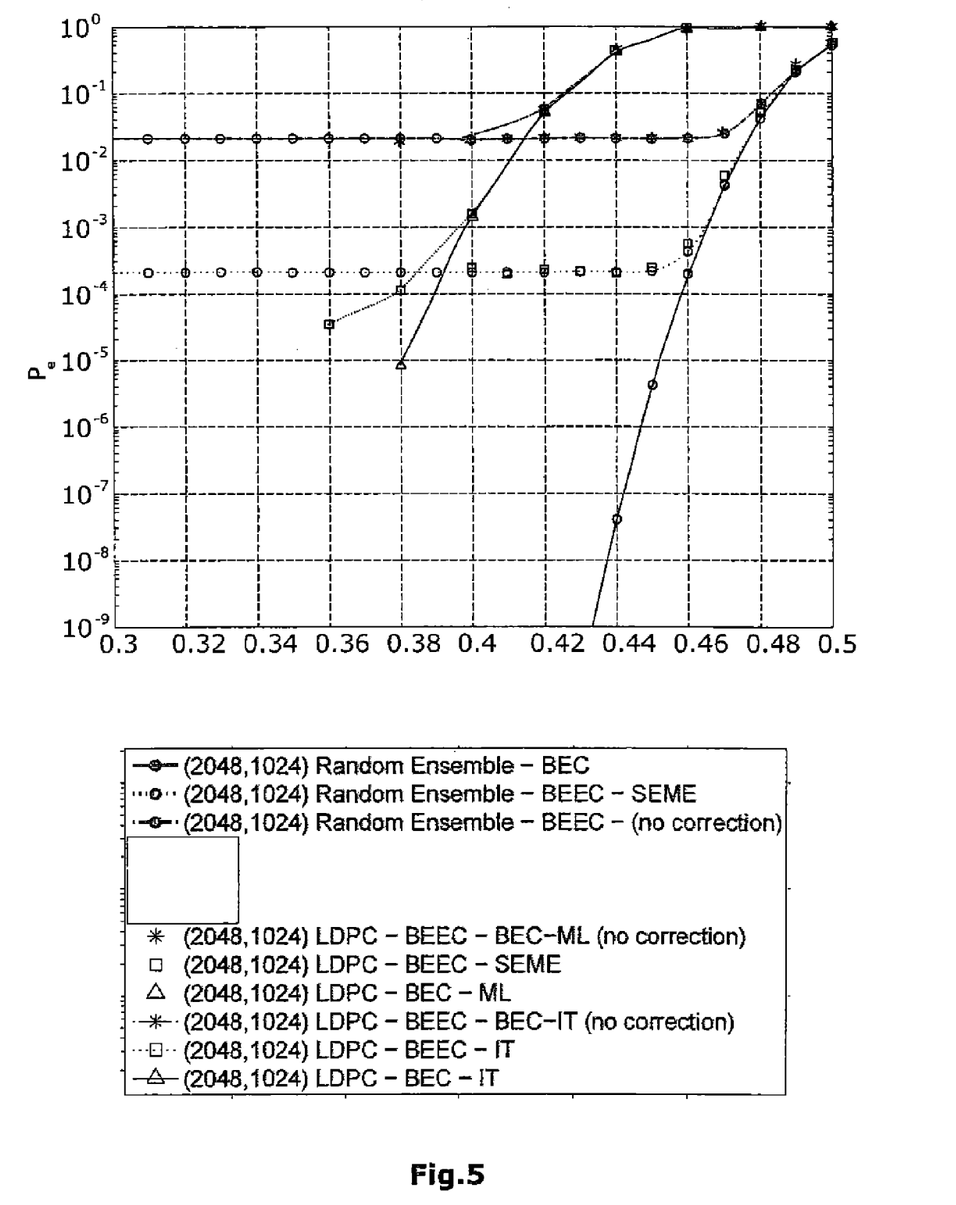
FIGS. 5, 6a and 6b show the erasure probability versus the codeword error rate.
Figure 6B:
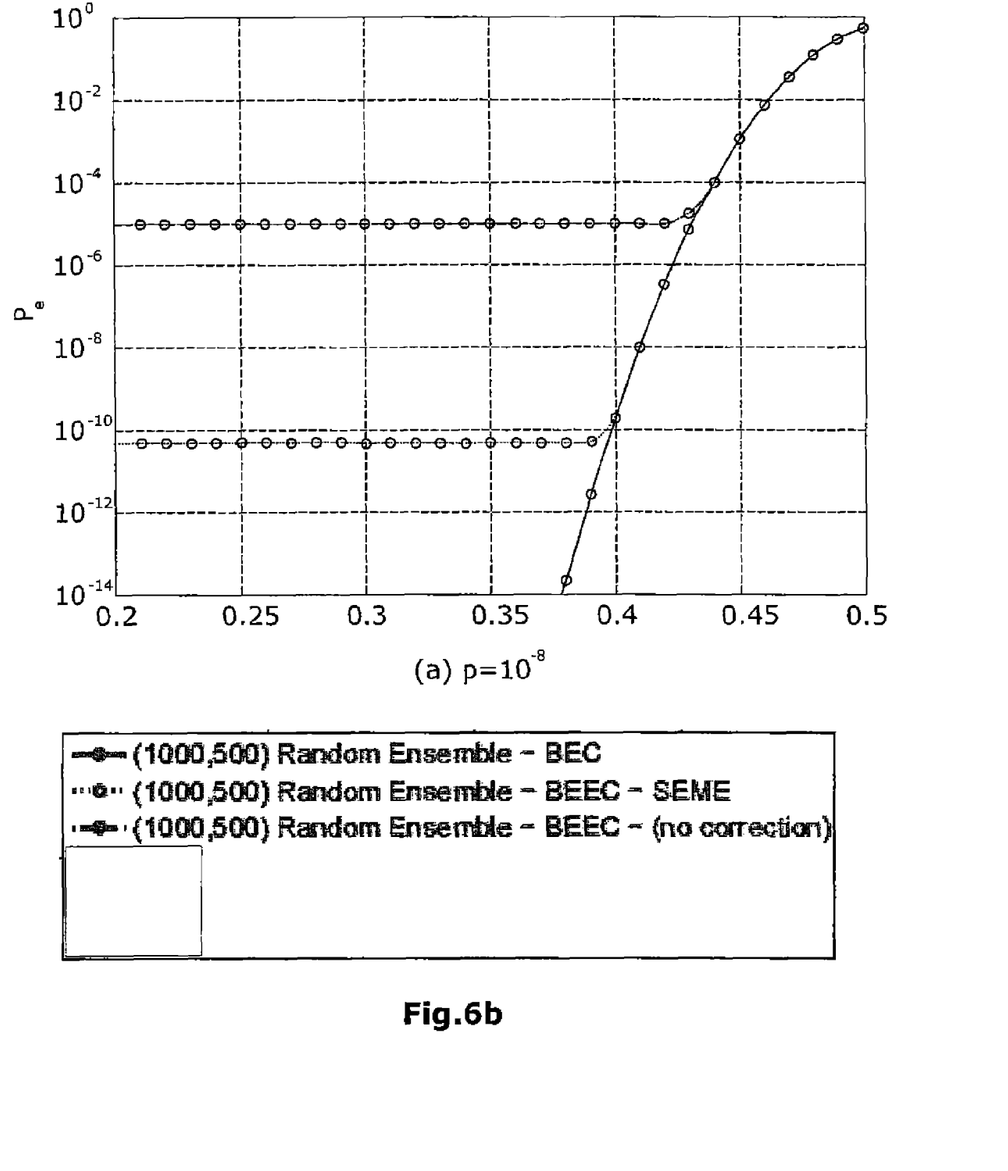

In FIG. 5 simulation results are provided for a (2048, 1024) generalized irregular repeat-accumulate (GeIRA) code designed for ML decoding. The code performance has been simulated over the BEC under efficient ML decoding, and over the BEEC under SEME decoding and without error correction. The simulation results illustrate how LDPC codes can approach the average random code ensemble performance in the three cases, at least down to moderate to low block error probabilities. The performance for the same LDPC code under more complex iterative (IT) decoding using soft values is provided too, for three cases: On the BEC (i.e., p=0), on the BEEC with IT erasure decoding (i.e., no error correction), and on the BEEC with soft input log likelihood ratios (LLRs) set according to the channel error/erasure probabilities. The performance under IT decoding on the BEC shows clearly the coding gain loss with respect to (w.r.t.) the ML decoder case. A block error rate $P_e=10^{-4}$ is achieved by the IT decoder at e≅0.39, whereas under ML decoding the target is achieved at e≅0.46. On the BEEC channel, the SEME decoder outperforms the IT one down to moderate error rates ($P_e \cong 10^3$). However, as the erasure probability decreases, the performance of the SEME algorithms converges to a block error probability $P_e \cong 2*10^4$, due to the limited (single) error correction capability of the algorithm itself. Since IT decoder is not limited to correct single errors, at low erasure probabilities IT decoding outperforms the SEME algorithm. This effect may be exploited by an hybrid SEME/IT decoder, e.g. the IT decoder might used whenever multiple errors are detected by the SEME decoder. Still, in many practical cases, the BEEC error probability may be quite below $p=10^{-5}$, resulting in a (much) lower error floor for the SEME algorithm, reducing hence the need of an IT decoding stage. In fact, the gain in the error floor due to the single error correction capability of the SEME algorithm is amplified at lower error probabilities p. In FIG. 6($a$) and FIG. 6($b$), the bounds for the average random ensemble block error probability are displayed for the case of n=1000, k=500 and for two BEEC error probabilities, $p=10^{-6}$ and $p=10^{-8}$. While in the former case, the floor is reduced by 3 orders of magnitude, in the latter case under SEME decoding the block error probability meets the floor at $P_e>10^{-10}$, nearly 5 order of magnitude lower w.r.t. the case when no error correction is performed. Note that the bound (13) in the error floors under SEME decoding provides an accurate estimation of the block error probability for e→0. In fact, for n=1000, k=500, $p=10^{-6}$, the error floor estimated by appears at $\overline{P}_{e,R(nk)}^{SEME,BEEC} \approx 4.99*10^{-7}$ as depicted in FIG. 6($a$), while for n=1000, k=500, $p=10^{-8}$ $\overline{P}_{e,R(n,k)}^{SEME,BEEC} \approx 5*10^{-11}$, as in FIG. 6($b$).

The method proposed here can be applied in all types of commercial wireless and wired transmission systems. Usually, the assumption that error detection on physical layer does fail with low probability is realistic for most communication systems. As demonstrated this causes a non negligible error floor. The proposed modifications of the efficient ML decoder permit to perform single error correction also on platforms with low computational power and hence to reduce the error floor. The decoding algorithm can be used with any linear block code. Nevertheless, the main target for the presented decoder is low density parity check codes (LDPC) due to their efficient encoding and decoding properties.

What is claimed is:

1. Method for recovery and correction of corrupted data transmitted from a sending device to a receiver device, the method comprising:
   Encoding the corrupted data by an encoder connected to the sending device,
   Transmitting the corrupted data from the sending device to the receiver device via a transmitting device, and
   Decoding the corrupted data by a decoder connected to the receiver device, whereby the corrupted data is recovered during decoding is conducted by solving a system of equations of a parity check matrix H,
whereby a transmitted codeword is divided on the receiver side into a correctly received part and a missing part and the following equation (1) holds:

$$H_{\bar{K}} x_{\bar{K}} = H_K x_K, \quad (1)$$

whereby a matrix $H_{\bar{K}}$ is manipulated so that its lower part contains only zero entries leading to the following equation (2)

$$H'_{\bar{K}} * x'_{\bar{K}} = H'_K * x'_K, \quad (2)$$

whereby $x'_{\bar{K}}$ corresponds to some unknown codeword symbols and $x'_K$ corresponds to known codeword symbols,
whereby $H_K$ is the part of the parity check matrix H corresponding to the missing part of the transmitted codeword $x_{\bar{K}}$ and $H_K$ is the part of the parity check matrix H corresponding to the correctly received part of the transmitted codeword $x_K$, the method further comprising the following method steps:
   Multiplying correctly received symbols $x'_K$ with a corresponding part $H'_K$, whereby this multiplication yields in a syndrome s', and
   Checking lower b-a rows of the syndrome s', namely s" for non-zero entries, whereby a row vector e is generated containing 1 if a non-zero entry is found, otherwise zero,
the method being further comprising the following method steps for correcting a single erroneous symbol in the transmitted codeword:
   If all non-zero entries of s" are the same, checking which columns of $H''_K$ as lower part of $H'_K$ are equal to a vector e,
      whereby if exactly one column of the part $H'_K$ is identified a corresponding erroneous symbol in the transmitted codeword is identified, and
      the corresponding erroneous symbol in the transmitted codeword is corrected by subtraction of an identified non-zero value from the corresponding erroneous symbol, whereby in case of a single error all non-zero entries in the b-a lower rows of the syndrome s' are equal.

2. Method according to claim 1, whereby $H'_{\bar{K}}$ corresponds to a submatrix $P_I$ generated by the following steps:
   Bringing $H_K$ in triangular form by column and/or row permutations,
   Moving columns of a submatrix B of $H_{\bar{K}}$ which block a triangularization process into a submatrix P of $H_{\bar{K}}$ so that the triangularization process can be continued, until $H_{\bar{K}}$ except the submatrix P is brought into triangular form,
   whereby $P_I$ corresponds to a dense lower part of submatrix P generated by zeroing out submatrix D of parity check matrix H,
   Performing manipulations on $P_I$, so that the lower b-a rows contain only zeros.

3. Method according to claim 1, wherein, after correction of a single error in the transmitted codeword, the syndrome s' is corrected by the following steps:
   Identifying all elements of the syndrome s' for which the corresponding erroneous symbol has been considered in the calculation, and
   Subtract an error pattern of a reduced syndrome s" from identified rows of s', whereby the error pattern is given by any non-zero row of s' in case of a single error.

4. Method according to claim 2, wherein correction of a single error in the transmitted codeword is conducted by the following method steps:
   1. Given a set of equations $H_{\bar{K}} * x_{\bar{K}} = H_K * x_K$, where $x_{\bar{K}}$ denotes an unknown and $x_K$ a known vector of symbols and $H_{\bar{K}}$ and $H_K$ respectively the corresponding part of the original parity check matrix, compute if possible a reduced sized matrix $P_I$ on which brute-force Gaussian elimination can be applied, according to the method steps described in claim 2, whereby a is the number of columns and b is the number of rows of $P_I$,
   2. Performing forward Gaussian elimination step,
      a. In case rank($P_1$)==a, apply forward elimination on the matrix $P_I$, leading to a system of equations $H'_{\bar{K}} * x'_{\bar{K}} = H'_K * x'_K = s'$, whereby $H'_K$ corresponds to $P_I$ in upper triangular form,
         i. If a==b, no error correction is possible, continue with step 6,
         ii. Otherwise proceed with step 3,
      b. If rank($P_1$)≠a stop decoding and signal failure,
   3. Detecting if the codeword contains errors:
      a. If a==b, no error detection is possible, continue with step 6,
      b. If a<b consider the vector s" made up of the rows a+1, . . . , b of the syndrome vector s' and check for non-zero entries in s" that represent inconsistencies, whereby a vector e is defined containing a row numbers of the detected non-zero entries in s",
         i. If e is empty, no errors in the transmitted codeword were found, continue with step 6,
         ii. If e is not empty, and the non-zero entries of the syndrome do not have the same value, multiple errors have been detected so that correction is not possible, and decoding is stopped and decoding failure due to multiple errors is signalled,
         iii. Otherwise, continue with 4,
   4. Identifying the erroneous symbol by considering the sub matrix $H''_K$ that is made up of the rows a+1, . . . , b of $H'_K$, search for columns in $H''_K$ that have non-zero entries only at the rows specified by e:
      a. If no columns are found, no error correction is possible, so that decoding is stopped and decoding failure due to error in the transmitted codeword is signalled, or
      b. If multiple columns are found, no error correction is possible, so that decoding is stopped and decoding failure due to error in the transmitted codeword is signalled, or
      c. If a single column is found, error correction is possible, denote a number of the column by t and continue with next step,
   5. Performing single error correction by taking any non-zero entry of the reduced syndrome s" and subtract it from the code symbol corresponding to the identified column t, whereby for GF(2) and extension fields of GF(2), the subtraction corresponds to an addition,
   6. Correcting the syndrome s' by (i) identifying all elements of the syndrome s' for which the corresponding erroneous symbol has been considered in the calculation, and subtracting an error pattern of a reduced syndrome s" from identified rows of s', whereby the error pattern is given by any non-zero row of s' in case of a single error, or (ii) recomputing it from $s'=H''_{\bar{K}} * x'_{\bar{K}}$ considering a corrected value of a code symbol in $x'_{\bar{K}}$, 7. Performing back substitution and get unknown pivots $x'_{\bar{K}}$ considering a corrected version of the syndrome s',
8. If Gaussian elimination was successful, do the back substitution to recover remaining unknowns, otherwise, decoding failed.

* * * * *